United States Patent
Putra et al.

(10) Patent No.: US 11,765,006 B2
(45) Date of Patent: Sep. 19, 2023

(54) METHODS AND APPARATUS FOR DEMODULATING DIGITAL SIGNALS

(71) Applicant: STMicroelectronics Asia Pacific Pte Ltd., Singapore (SG)

(72) Inventors: Ade Putra, Singapore (SG); Kusuma Adi Ningrat, Singapore (SG); Mythreyi Nagarajan, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 0 days.

(21) Appl. No.: 17/245,890

(22) Filed: Apr. 30, 2021

(65) Prior Publication Data

US 2022/0353119 A1 Nov. 3, 2022

(51) Int. Cl.
*H04L 27/22* (2006.01)
*G06F 3/041* (2006.01)
*H03M 1/12* (2006.01)

(52) U.S. Cl.
CPC .......... *H04L 27/22* (2013.01); *G06F 3/04162* (2019.05); *G06F 3/04166* (2019.05); *H03M 1/124* (2013.01)

(58) Field of Classification Search
CPC . H04L 27/22; G06F 3/04166; G06F 3/04162; H03M 1/124
See application file for complete search history.

(56) References Cited

U.S. PATENT DOCUMENTS

| | | | | |
|---|---|---|---|---|
| 5,621,345 A | * | 4/1997 | Lee | H03D 7/165 327/552 |
| 2003/0012307 A1 | * | 1/2003 | Martin | H04L 27/2332 375/324 |
| 2015/0331509 A1 | * | 11/2015 | Huang | G06F 3/0446 345/173 |
| 2017/0115816 A1 | * | 4/2017 | Chang | G06F 3/03545 |

OTHER PUBLICATIONS

English Translation of KR 2017-0076025 (Year: 2017).*
English Translation of WO 2020/050634 (Year: 2020).*

* cited by examiner

*Primary Examiner* — Patrick N Edouard
*Assistant Examiner* — Eboni N Giles
(74) *Attorney, Agent, or Firm* — Slater Matsil, LLP

(57) ABSTRACT

A device includes an analog to digital converter configured to convert voltages into a digital signal by sampling the voltages at a fixed sampling time; a first multiplier configured to multiply the digital signal with in-phase coefficients, the in-phase coefficients generated to produce a demodulated in-phase signal at a demodulation signal frequency; a first adder configured accumulate the demodulated in-phase signal to output in-phase magnitude values; a second multiplier configured to multiply the digital signal with quadrature coefficients, the quadrature coefficients generated to produce a demodulated quadrature signal at the demodulation signal frequency; and a second adder configured to accumulate the demodulated quadrature signal to output quadrature magnitude values.

20 Claims, 12 Drawing Sheets

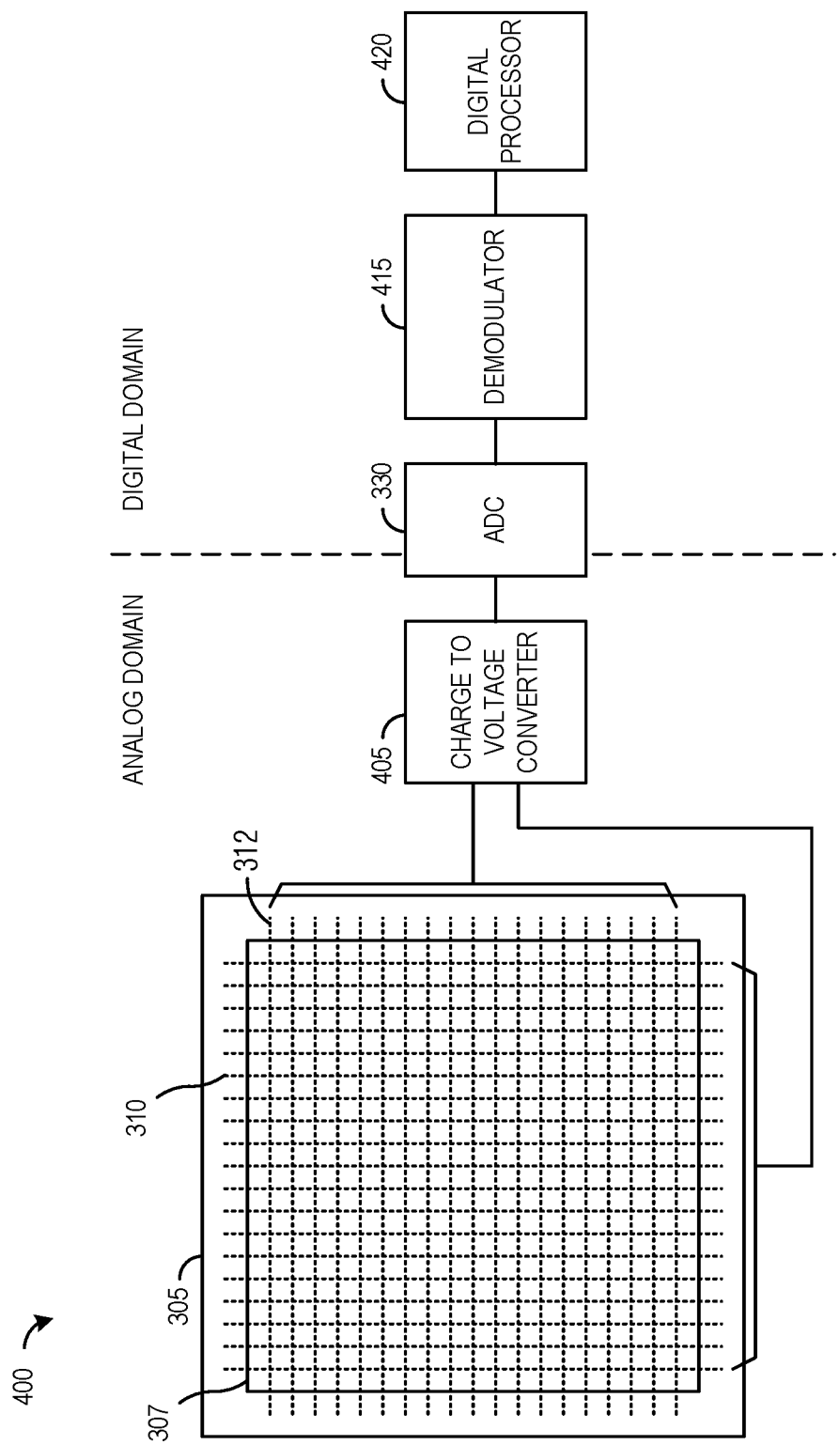

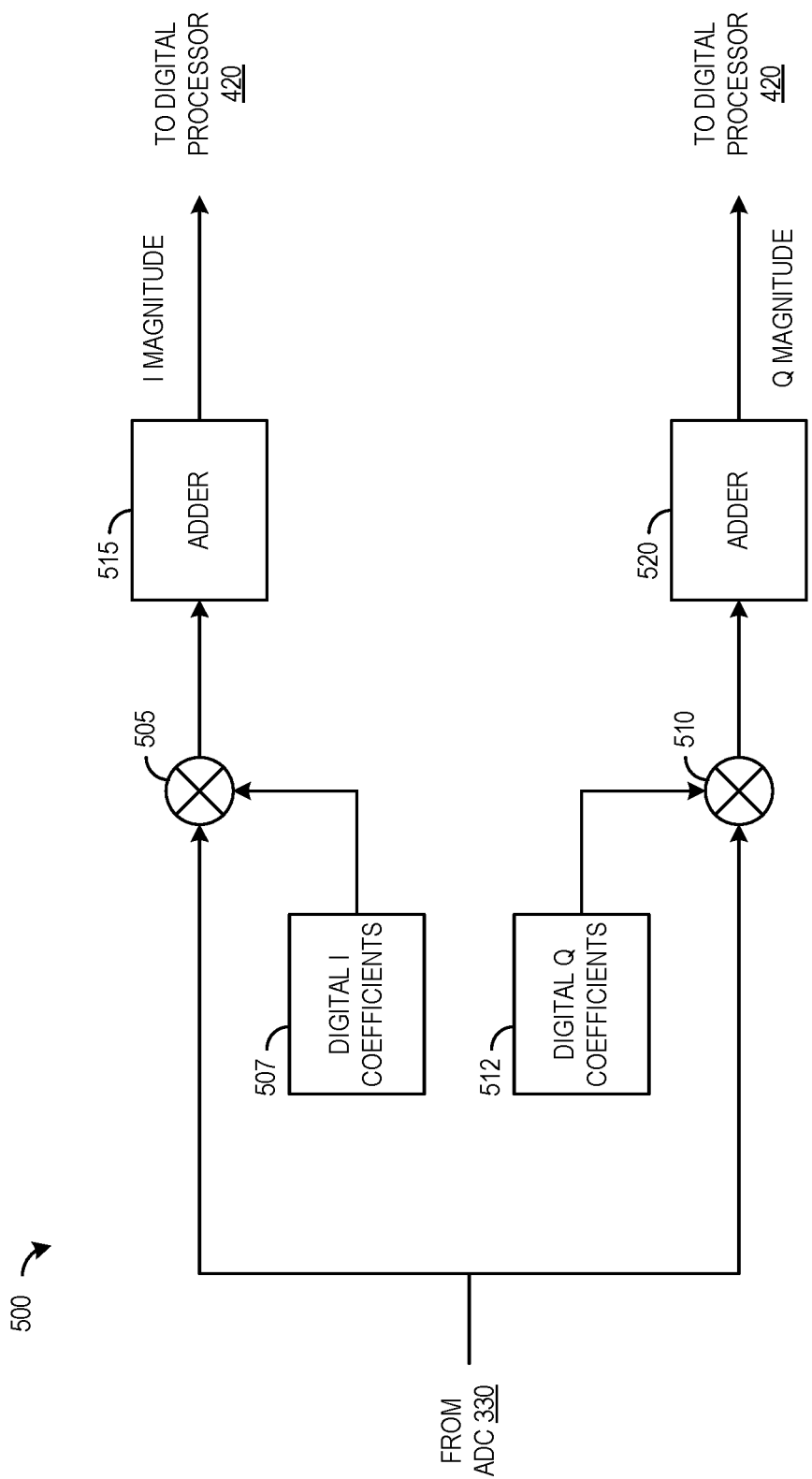

METHODS AND APPARATUS FOR DEMODULATING DIGITAL SIGNALS

TECHNICAL FIELD

The present invention relates generally to methods and apparatus for demodulating digital signals.

BACKGROUND

The presence of noise in a signal can make the signal more difficult to demodulate. The noise can reduce the efficiency of the signal or introduce errors to the demodulated signal. As an example, in a digital device with inputs through a touch sensitive display, display noise or charger noise may negatively impact the demodulation of the signal from the touch sensitive display of the digital device, resulting in a sluggishly performing device or an ill behaving device.

SUMMARY

In accordance with an embodiment, a device is provided. The device comprising: an analog to digital converter (ADC) configured to convert an input signal into a digital signal by sampling the input signal at a fixed sampling time; a first multiplier operatively coupled to the ADC, the first multiplier configured to multiply the digital signal with in-phase coefficients, the in-phase coefficients generated to produce a demodulated in-phase signal at a demodulation signal frequency; a first adder operatively coupled to the first multiplier, the first adder configured to accumulate the demodulated in-phase signal to output in-phase magnitude values; a second multiplier operatively coupled to the ADC, the second multiplier configured to multiply the digital signal with quadrature coefficients, the quadrature coefficients generated to produce a demodulated quadrature signal at the demodulation signal frequency; and a second adder operatively coupled to the second multiplier, the second adder configured to accumulate the demodulated quadrature signal to output quadrature magnitude values.

In accordance with an embodiment, a method for demodulating a signal is provided. The method comprising: digitizing the signal at a fixed sampling time; demodulating the digitized signal into a demodulated in-phase signal and a demodulated quadrature signal, the demodulating comprising: multiplying the digitized signal with in-phase coefficients generated to produce a demodulated in-phase signal at a demodulation signal frequency, and multiplying the digitized signal with quadrature coefficients generated to produce a demodulated quadrature signal at the demodulation signal frequency; and accumulating the demodulated in-phase signal and the demodulated quadrature signal to produce in-phase magnitude values and quadrature magnitude values.

In accordance with an embodiment, a method implemented by a device is provided. The method comprising: determining a demodulation signal frequency of a demodulator, a sampling time of a signal demodulated by the demodulator, and a number of demodulation coefficients; determining a number of signal cycles in accordance with the demodulation signal frequency, the sampling time, and the number of demodulation coefficients; generating the number of demodulation coefficients of in-phase coefficients; generating the number of demodulation coefficients of quadrature coefficients; and storing the in-phase coefficients and the quadrature coefficients.

An advantage of the embodiments is that the sampling time of analog to digital converters of the digital device remains fixed. Keeping the sampling time fixed simplifies the design of the digital device, which helps to keep the cost of the digital device low.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates a digital device with signal demodulation occurring in the digital domain according to an embodiment;

FIG. 5A illustrates a first example demodulator according to an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

In the ensuing description one or more specific details are illustrated, aimed at providing an understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Figure 1:
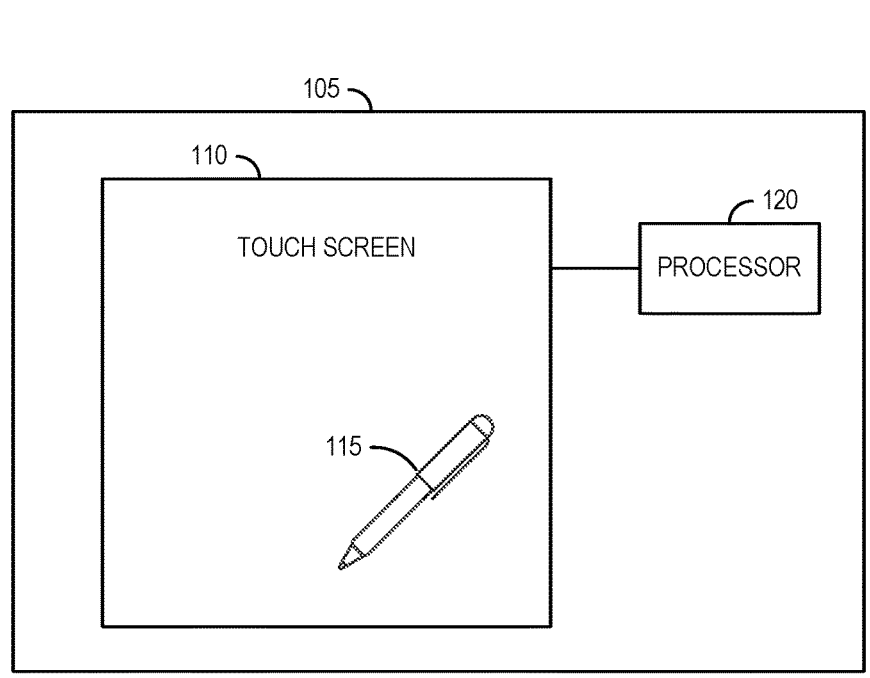
FIG. 1 illustrates a diagram of a digital device.

FIG. 1 illustrates a diagram 100 of a digital device 105. Digital device 105 includes a touch screen no that can receive input from touches of a user of digital device 105 or a stylus 115 controlled by the user. Touch screen 110 provides a signal conveying the input from the touches of the user or stylus 115 to a processor 120. Processor 120 provides data processing to act upon the input.

As discussed previously, the presence of noise in a signal (such as the signal provided from touch screen no) can reduce the efficiency of the signal or introduce errors to the signal. The noise in the signal may also make demodulating the signal more difficult. A prior art technique makes use of an analog front end (AFE) circuit measures the magnitude of the signal at a known phase and only measures Real component magnitudes only (discarding the Imaginary component magnitude).

Figure 2:
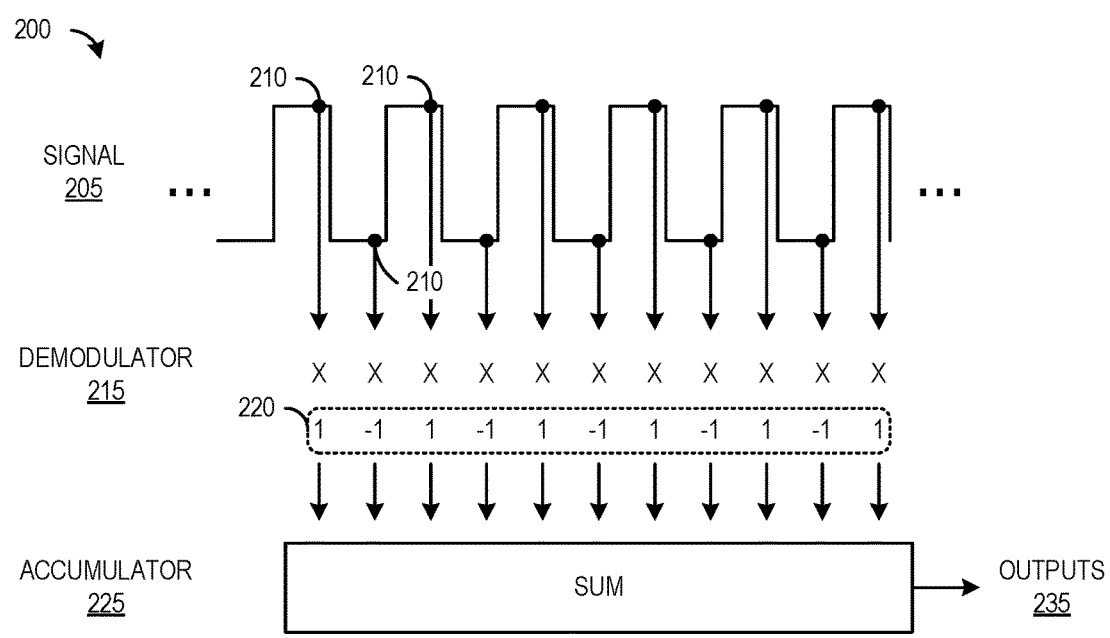
FIG. 2 illustrates a diagram highlighting the operation of the prior art technique utilizing an analog front end circuit to demodulate the signal in the presence of noise.

FIG. 2 illustrates a diagram 200 highlighting the operation of the prior art technique utilizing the AFE circuit to demodulate the signal in the presence of noise. A signal 205 is sampled at specific sampling times by an ADC to produce samples 210. As an example, signal 205 is sampled by the ADC with a sampling frequency that is two times the frequency of signal 205. Samples 210 are demodulated by a demodulator 215 using a demodulating sequence 220. Demodulating sequence 220 may be: 1, −1, 1, −1, 1, −1, 1, . . . , −1, for example. An accumulator 225 sums the output of demodulator 215 to produce outputs 235, which are the Real magnitudes of signal 205. As shown in FIG. 2, when signal 205 and the sampling performed by the ADC is synchronized, the Real magnitude measurements of signal 205 may be performed properly.

However, the AFE circuit is able to only measure signals with the same frequency and phase as demodulator 215. Noise in signal 205 with frequency near or about the same as the frequency of signal 205 or multiples thereof (e.g., fsignal, 3*fsignal, 5*fsignal, . . . , where fsignal is the frequency of signal 205) results in errors in the measurement, with the amount of the error being based on the phase. In general, the maximum error occurs when the noise is 0 and 180 degrees of phase with respect to demodulating sequence 220, while the minimum error occurs when the noise is 90 and 270 degrees of phase with respect to demodulating sequence 220. Furthermore, the AFE circuit is unable to measure the phase of signal 205 or the noise. Hence, the AFE circuit cannot be used to measure or decode data from an active stylus 115. Noise that has the same or about the same as the frequency of signal 205 may be undetectable when its phase is at approximately 90 or 270 degrees of demodulating sequence 220.

Figure 3:
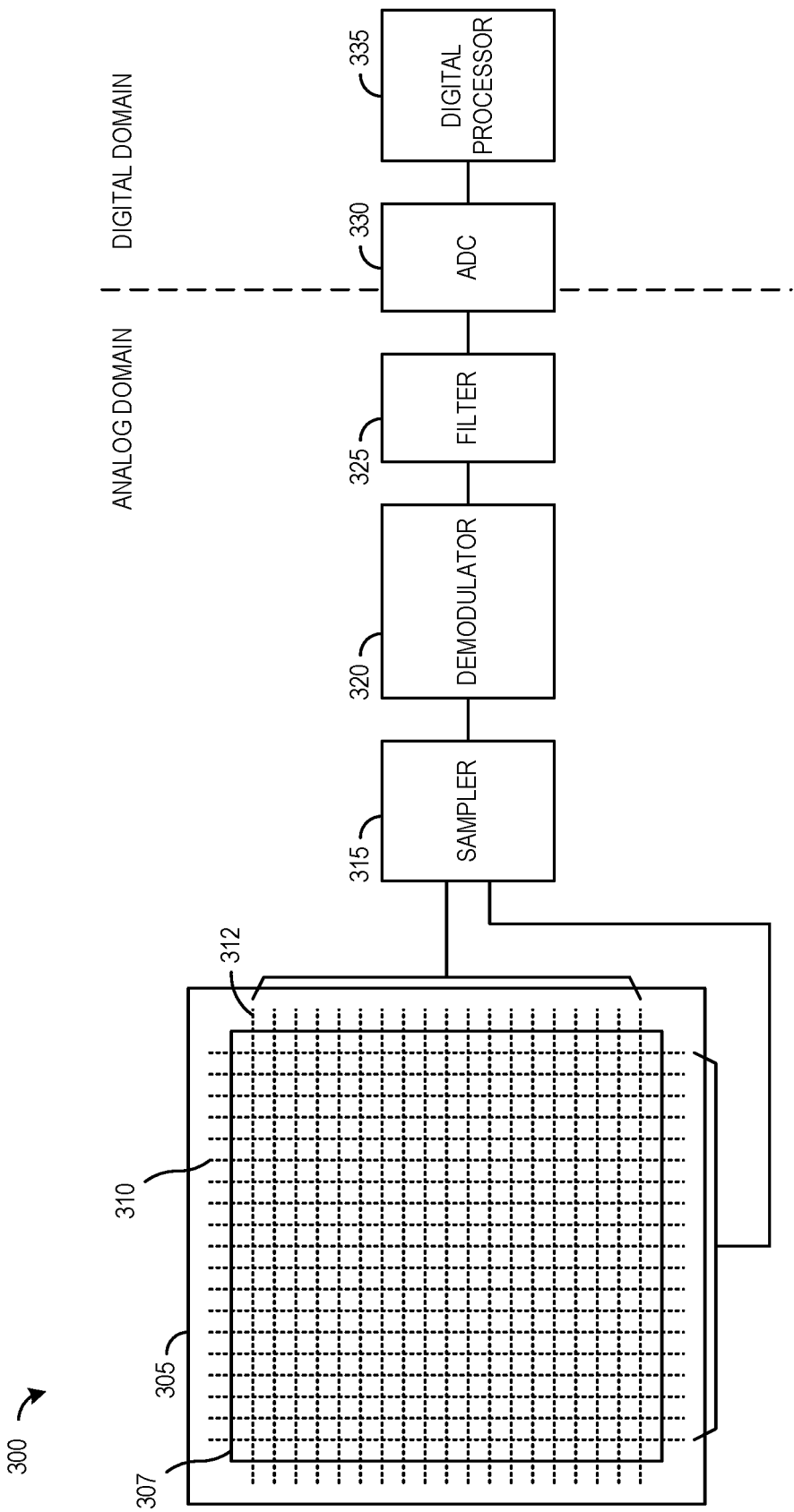
FIG. 3 illustrates a prior art digital device with signal demodulation occurring in the analog domain.

Another prior art technique utilizes an analog demodulator. FIG. 3 illustrates a prior art digital device 300 with signal demodulation occurring in the analog domain. Digital device 300 includes a touch sensitive display 305 with a touch sensitive area 307. Touch sensitive area 307 comprises vertical sense lines (such as vertical sense line 310) and horizontal sense lines (such as horizontal sense line 312) that produce an output signal responsive to a capacitive change at the sense lines. As an example, a finger at vertical sense line 310 and horizontal sense line 312 would result in a capacitance change. Hence, the output signals of vertical sense line 310 and horizontal sense line 312 will change. In a situation where the sense lines are relatively close together, the sense lines that are close to vertical sense line 310 and horizontal sense line 312 will also output changed signals, however, the change in such signals may be smaller than the change in signals corresponding to vertical sense line 310 and horizontal sense line 312.

A sampler 315 samples the sense lines of touch sensitive display 305 and generates a sequence of samples based on the charge or current in the sense lines. The sequence of samples is provided to demodulator 320 which demodulates the sequence of samples. Demodulator 320 may multiply the sequence of samples with a demodulating sequence, for example. The demodulating sequence having a demodulation signal frequency. An output of demodulator 320 is filtered by filter 325 to help filter noise from the output of demodulator 320, for example. Filter 325 may be a low pass filter, for example. An ADC 330 converts the analog output of filter 325 into digital values, which undergo digital processing by digital processor 335.

However, demodulator 320 requires analog multipliers and an analog low pass filter, which can complicate the design of digital device 300, as well as increase power consumption. Furthermore, analog multipliers and analog low pass filters may be difficult to tune.

According to an example embodiment, methods and apparatus for demodulating digital signals are provided. The methods and apparatus feature a fixed sampling rate ADC while providing digital demodulation of the digital signals with adjustable demodulation frequency to provide for improved noise rejection. Furthermore, the magnitudes of both the Real and Imaginary components of the digital signal are measured, thereby providing more accurate measurements. The availability of both the Real and Imaginary components also enable phase measurements. Supporting a fixed sampling rate ADC simplifies the design of the ADC, while performing demodulation in the digital domain eliminates the need for analog multipliers and filters. The simplification of the ADC design and the elimination of analog multipliers and filters reduce the complexity and cost of the overall device.

FIG. 4 illustrates a digital device 400 with signal demodulation occurring in the digital domain. Digital device 400 includes touch sensitive display 305 with a touch sensitive area 307. Touch sensitive area 307 comprises vertical sense lines (such as vertical sense line 310) and horizontal sense lines (such as horizontal sense line 312) that produce an output signal responsive to a capacitive change at the sense lines. A charge to voltage converter (CVC) 405, coupled to the vertical sense lines and the horizontal sense lines of touch sensitive display 305, convert the charges outputted by touch sensitive area 307 into voltages. CVC 405 produces a voltage that is proportional to an input current. CVC 405 may be a part of the AFE of digital device 400.

Digital device 400 also includes ADC 330. ADC 330 converts the output of CVC 405 into digital values. In other words, ADC 330 samples the output of CVC 405 and produces digital values corresponding to the samples. In an embodiment, ADC 330 operates at a fixed sampling frequency. The sampling rate of ADC 330 should be high enough to ensure an accurate representation of the output of CVC 405 is captured. As an example, the sampling rate of ADC 330 is greater than or equal to two times the sampling rate of the sense lines. In general, the greater the sampling rate of ADC 330 (as compared to the sampling rate of the sense lines), the errors and aliasing of signals are pushed to higher frequencies, which allows for simpler filters to eliminate such errors and aliased signals. As stated previously, operating at a fixed sampling frequency simplifies the design of ADC 330.

The samples outputted by ADC 330 are provided to demodulator 415, which demodulates the samples utilizing a sequence of digital coefficients. In an embodiment, demodulator 415 demodulates the samples using a sequence of digital in-phase coefficients and a sequence of digital quadrature coefficients. The demodulation of the samples using digital in-phase coefficients and digital quadrature coefficients produces in-phase and quadrature measurements of the output of the sense lines. The availability of the in-phase and quadrature measurements enables the measurement of the phase of the output of the sense lines.

In an embodiment, demodulator 415 supports different demodulation frequencies. The demodulation frequency of demodulator 415 is based on the inherent frequency of the demodulation sequences comprising the digital in-phase coefficients and the sequence of digital quadrature coefficients, which include the number of coefficients, as well as a number of cycles of the input signal forming a single period of the demodulation sequences. Hence, it is possible to change the demodulation frequency of demodulator 415 by changing the number of coefficients and the number of cycles of the input signal forming a single period of the demodulation sequences. Because demodulator 415 is a digital demodulator, changing the number of coefficients, as well as the number of cycles of the input signal, does not change the complexity of demodulator 415. A detailed discussion of the demodulation sequence of digital in-phase coefficients and the sequence of digital quadrature coefficients, and example techniques for generating the demodulation sequence of digital in-phase coefficients and the sequence of digital quadrature coefficients are provided below.

The output of demodulator 415, e.g., the in-phase measurements and the quadrature measurements, are provided to a digital processor 420. Digital processor 420 provides computational processing of the outputs. As an example, the computational processing of the outputs may move a cursor, select an icon, execute an application, send a message, close a program, etc. Digital processor 420 may also provide digital signal processing of the outputs. As an example, digital processor 420 may filter the outputs, amplify the outputs, determine a phase from the outputs, determine a magnitude from the outputs, and so forth.

FIG. 5A illustrates a first example demodulator 500. Demodulator 500 may be an implementation of demodulator 415 of FIG. 4. Demodulator 500 includes a first multiplier 505 configured to multiply the samples outputted by ADC 330 with digital in-phase coefficients 507 of the demodulation sequence. Demodulator 500 also includes a second multiplier 510 configured to multiply the samples outputted by ADC 330 with digital quadrature coefficients 512 of the demodulation sequence. Digital in-phase coefficients 507 and digital quadrature coefficients 512 are associated with a demodulation frequency, which may be adjusted by changing the number of coefficients and the number of cycles of the input signal forming a single period of digital in-phase coefficients 507 and digital quadrature coefficients 512, respectively. Digital in-phase coefficients 507 and digital quadrature coefficients 512 may be generated a priori, and saved to a memory for subsequent use. A detailed description of an example technique for generating the demodulation sequences (digital in-phase coefficients 507 and digital quadrature coefficients 512) is provided below.

The outputs of multiplier 505 (digital in-phase coefficients 507 multiplied with the samples outputted by ADC 330) are provided to adder 515. Adder 515 sums up the outputs of multiplier 505 to produce in-phase measurements (e.g., in-phase magnitudes) of the samples outputted by ADC 330. The outputs of multiplier 510 (digital quadrature coefficients 512 multiplied with the samples outputted by ADC 330) are provided to adder 520. Adder 520 sums up the outputs of multiplier 510 to produce quadrature measurements (e.g., quadrature measurements) of the samples outputted by ADC 330. The in-phase measurements and the quadrature measurements (outputs of adders 515 and 520) are provided to digital processor 420 for additional signal processing.

Figure 5B:
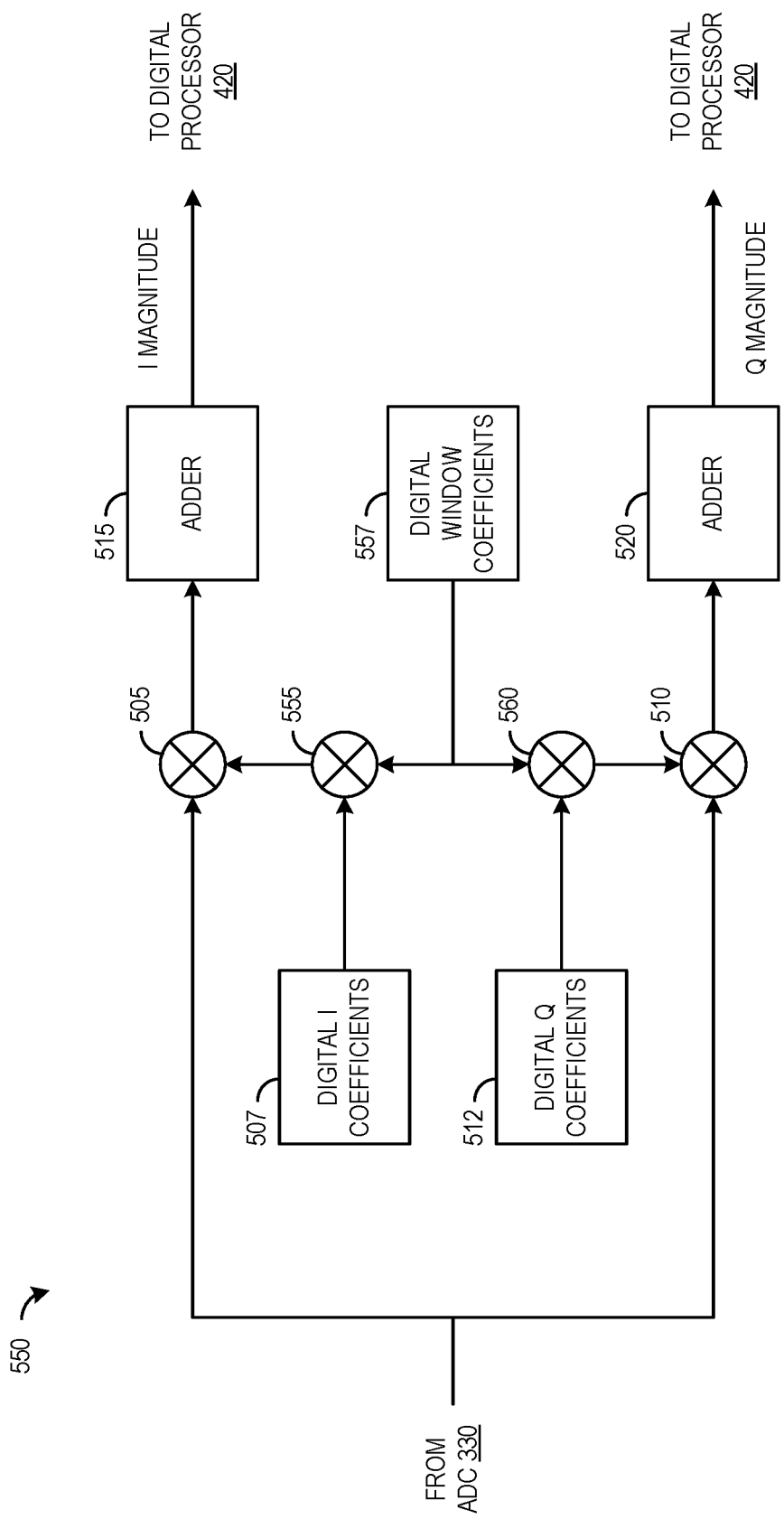
FIG. 5B illustrates a second example demodulator according to an embodiment.

FIG. 5B illustrates a second example demodulator 550. Demodulator 550 may be an implementation of demodulator 415 of FIG. 4. Demodulator 550 includes first multiplier 505 configured to multiply the samples outputted by ADC 330 with windowed digital in-phase coefficients, where the windowed digital in-phase coefficients are digital in-phase coefficients 507 multiplied with digital windowing function coefficients 557 by a third multiplier 555 Demodulator 550 includes second multiplier 510 configured to multiply the samples outputted by ADC 330 with windowed digital quadrature coefficients, where the windowed digital quadrature coefficients are digital quadrature coefficients 512 multiplied with digital windowing function coefficients 557 by a fourth multiplier 560. Digital in-phase coefficients 507 and digital quadrature coefficients 512 are associated with a demodulation frequency, which may be adjusted by changing the number of coefficients and the number of cycles of the input signal forming a single period of the demodulation sequence (digital in-phase coefficients 507 and digital quadrature coefficients 512). Digital in-phase coefficients 507 and digital quadrature coefficients 512 may be generated a priori, and saved to a memory for subsequent use.

Digital windowing function coefficients 557 may be specified to realize any shape of window. Example windows include square, triangular, rectangular, Hann, bell-shaped curve, and so forth. The number of coefficients of digital windowing function coefficients 557 may also be specified. Additionally, a number of digital samples multiplied by a single digital windowing function coefficient may be specified. A detailed description of example digital windowing function coefficients is provided below. Digital windowing function coefficients 557 may be an implementation of a digital filter, for example.

The outputs of multiplier 505 (windowed digital in-phase coefficients 507 multiplied with the samples outputted by ADC 330) are provided to adder 515. Adder 515 sums up the outputs of multiplier 505 to produce in-phase measurements (e.g., in-phase magnitudes) of the samples outputted by ADC 330. The outputs of multiplier 510 (windowed digital quadrature coefficients 512 multiplied with the samples outputted by ADC 330) are provided to adder 520. Adder 520 sums up the outputs of multiplier 510 to produce quadrature measurements (e.g., quadrature measurements) of the samples outputted by ADC 330. The in-phase measurements and the quadrature measurements (outputs of adders 515 and 520) are provided to digital processor 420 for additional signal processing.

Figure 6A:
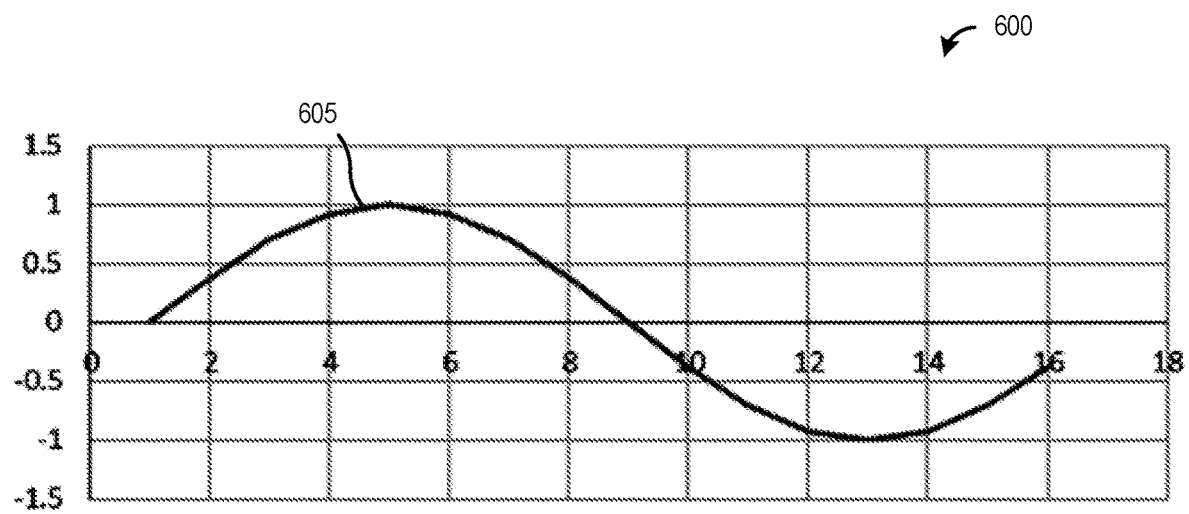
FIG. 6A illustrates a graph of a waveform representing a 16 coefficient demodulation sequence according to an embodiment.

FIG. 6A illustrates a graph 600 of a waveform 605 representing a 16 coefficient demodulation sequence. Waveform 605 is a continuous line connecting the 16 coefficient demodulation sequence. Waveform 605 represents one cycle of a sinusoidal signal and may be examples of digital in-phase coefficients or digital quadrature coefficients. The actual demodulation sequence would be made up of multiple repetitions of waveform 605. Waveform 605 may be generated a priori and stored in a memory. As an example, waveform 605 may be stored in tabular form, with the values of waveform 605 corresponding to different indices being represented with a binary value. Waveform 605 may be retrieved from memory and provided to demodulator 415 as needed. Table 1 illustrates an example table of the 16 coefficient demodulation sequence.

TABLE 1

Table of example 16 coefficient demodulation sequence.

| Index | Coeff |
|---|---|
| 0 | 0 |
| 1 | 0.38 |
| 2 | 0.71 |
| 3 | 0.92 |
| 4 | 1 |
| 5 | 0.92 |
| 6 | 0.71 |
| 7 | 0.38 |
| 8 | 0 |
| 9 | −0.4 |
| 10 | −0.7 |
| 11 | −0.9 |
| 12 | −1 |
| 13 | −0.9 |
| 14 | −0.7 |
| 15 | −0.4 |

In an embodiment, in order to realize the demodulation sequences, the following information is used:
Number of cycles of the demodulation sequences with a number of coefficients. As an example, the demodulation sequences comprises 3 cycles with 32 coefficients, hence, the coefficients may be expressed as $$\cos\left(\frac{3\cdot 2\pi}{32}n\right) \text{ and } \sin\left(\frac{3\cdot 2\pi}{32}n\right).$$

where n is the coefficient index.
The length of the demodulation sequences is N (32 in the example above). Then at coefficient index 31, the coefficient index is looped back to 0.
The demodulation sequences will then loop continuously.

Figure 6B:
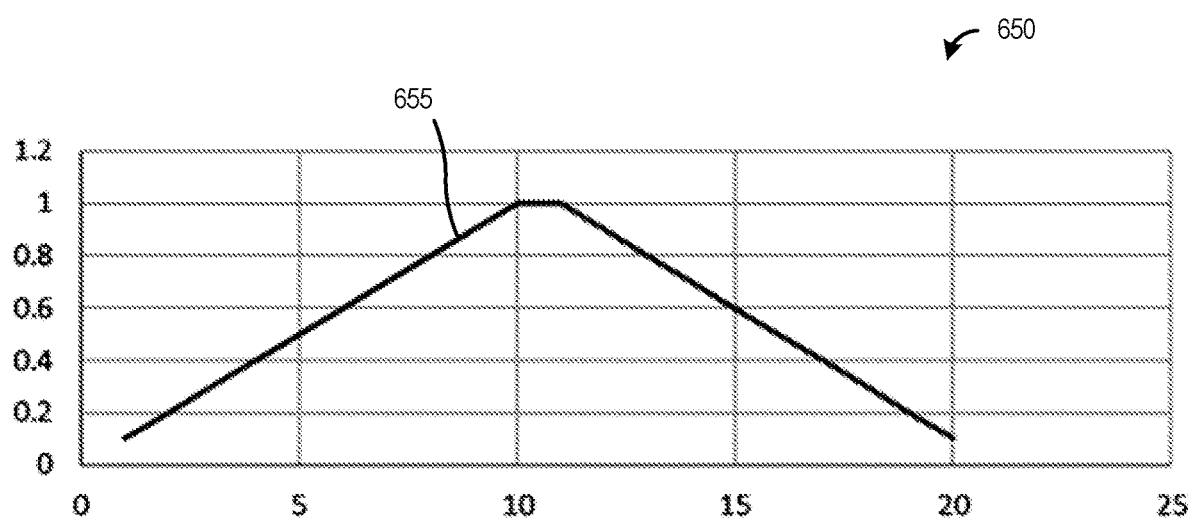
FIG. 6B illustrates a graph of a waveform representing a 20 coefficient windowing sequence according to an embodiment.

FIG. 6B illustrates a graph 650 of a waveform 655 representing a 20 coefficient windowing sequence. Waveform 655 is a continuous line connecting the 20 coefficient windowing sequence. Waveform 655 represents a triangular windowing function used to window digital in-phase coefficients and digital quadrature coefficients, for example. Waveform 655 may be generated a priori and stored in a memory. As an example, waveform 655 may be stored in tabular form, with the values of waveform 655 corresponding to different indices being represented with a binary value. Waveform 655 may be retrieved from memory and provided to demodulator 415 as needed. Other types of windowing functions, as well as different sized windowing functions, may be used in demodulator 415. Table 2 illustrates an example table of the 20 coefficient windowing sequence.

TABLE 2

Table of example 20 coefficient window sequence.

| Index | Coeff |
|---|---|
| 0 | 0.1 |
| 1 | 0.2 |
| 2 | 0.3 |
| 3 | 0.4 |
| 4 | 0.5 |
| 5 | 0.6 |
| 6 | 0.7 |
| 7 | 0.8 |
| 8 | 0.9 |
| 9 | 1 |
| 10 | 1 |
| 11 | 0.9 |
| 12 | 0.8 |
| 13 | 0.7 |
| 14 | 0.6 |
| 15 | 0.5 |
| 16 | 0.4 |
| 17 | 0.3 |
| 18 | 0.2 |
| 19 | 0.1 |

In an embodiment, in order to realize the windowing sequence, the following information is used:
The length of the windowing sequence, N.
The number of samples multiplied by a single windowing sequence coefficient, M.
The type of windowing function (e.g., triangular, square, rectangular, Hann, bell-shaped curve, etc.).
With the above information, a stream of data from ADC 330 with length N×M is multiplied by the windowed modulation sequences. A diagram of example windowed modulation sequences are provided below.

Figure 7A:
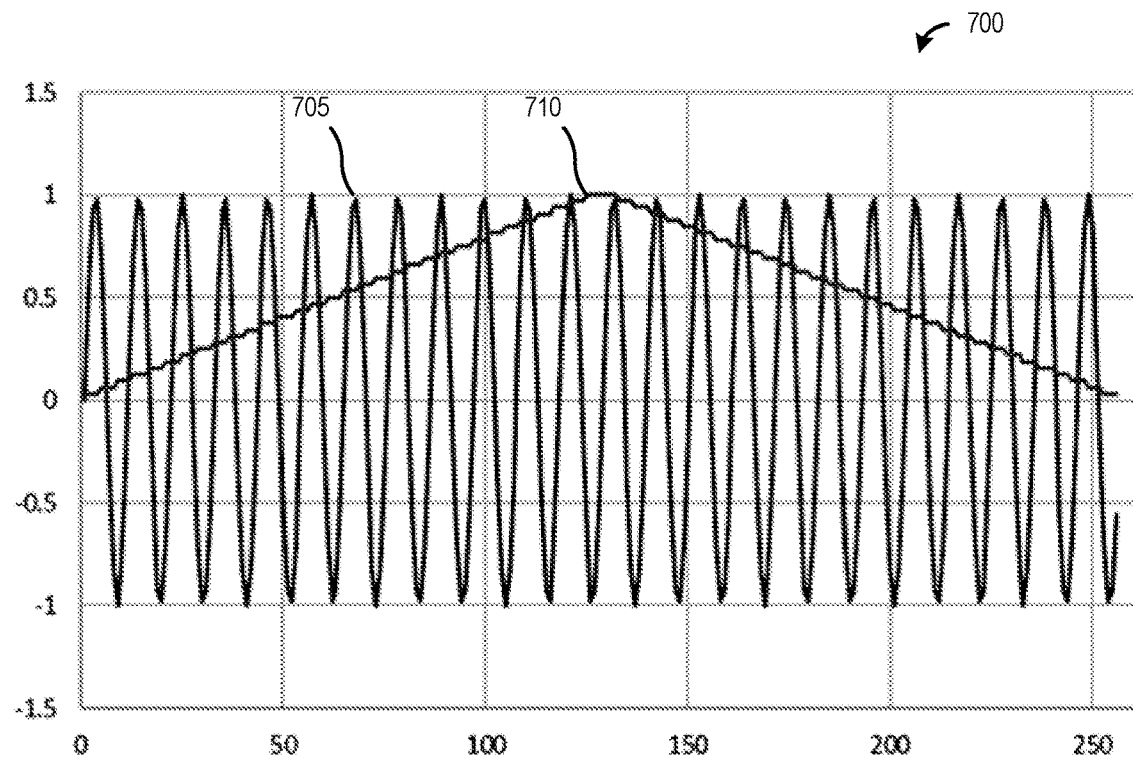
FIGS. 7A and 7B illustrate graphs of waveforms representing demodulation sequences and a windowing sequence according to an embodiment.
Figure 7B:
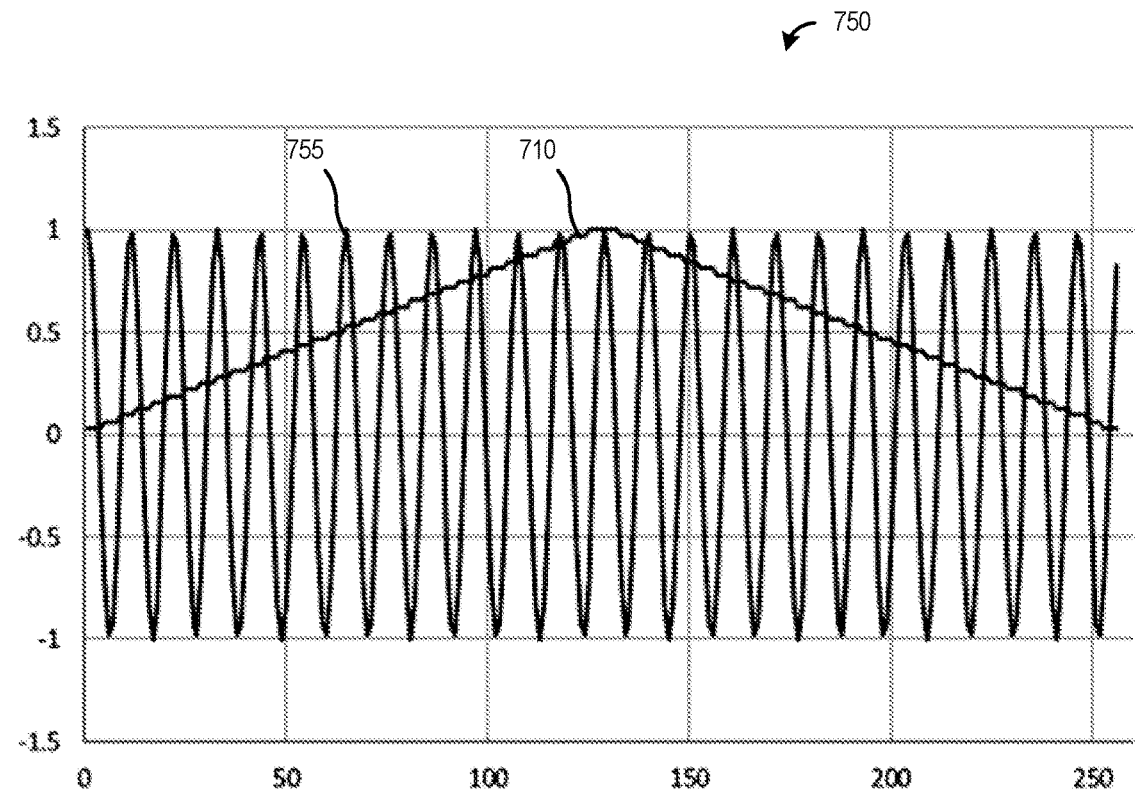

FIGS. 7A and 7B illustrate graphs 700 and 750 of waveforms representing demodulation sequences and a windowing function sequence 710. Waveform 705 represents a digital in-phase demodulation sequence and waveform 755 represents a digital quadrature demodulation sequence.

Figure 8A:
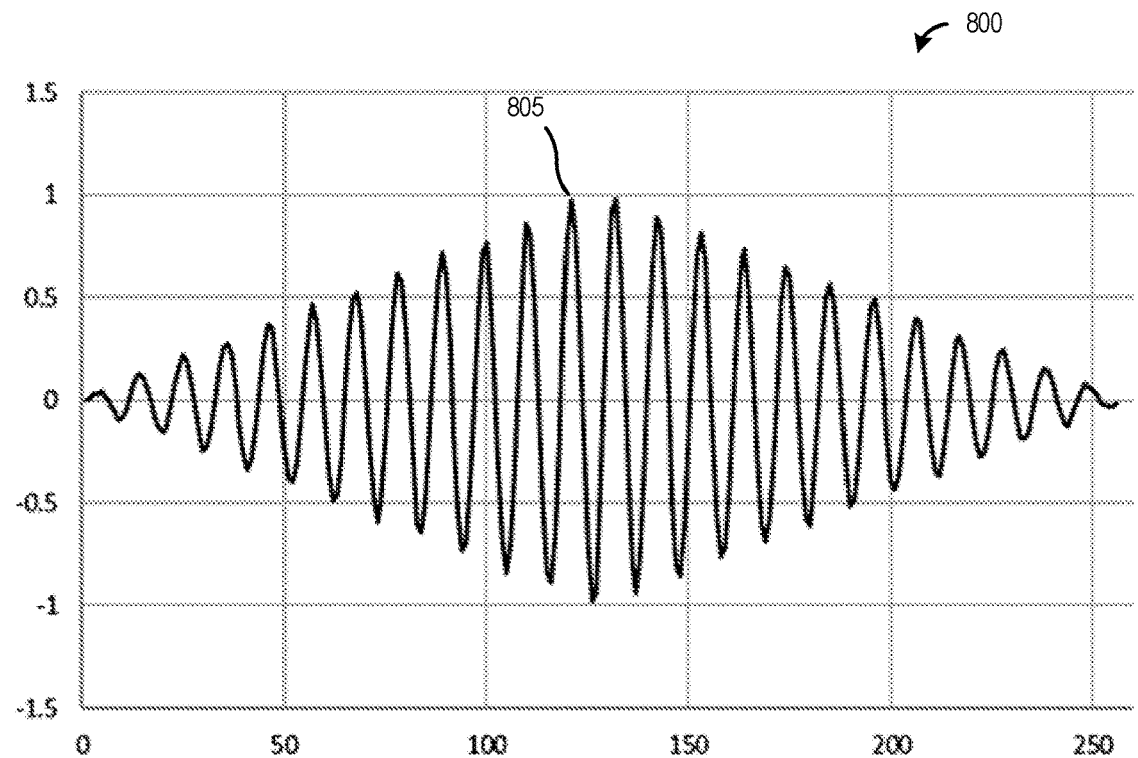
FIGS. 8A and 8B illustrate graphs of waveforms representing the results of the multiplication of a demodulation sequence with a windowing sequence according to an embodiment.
Figure 8B:
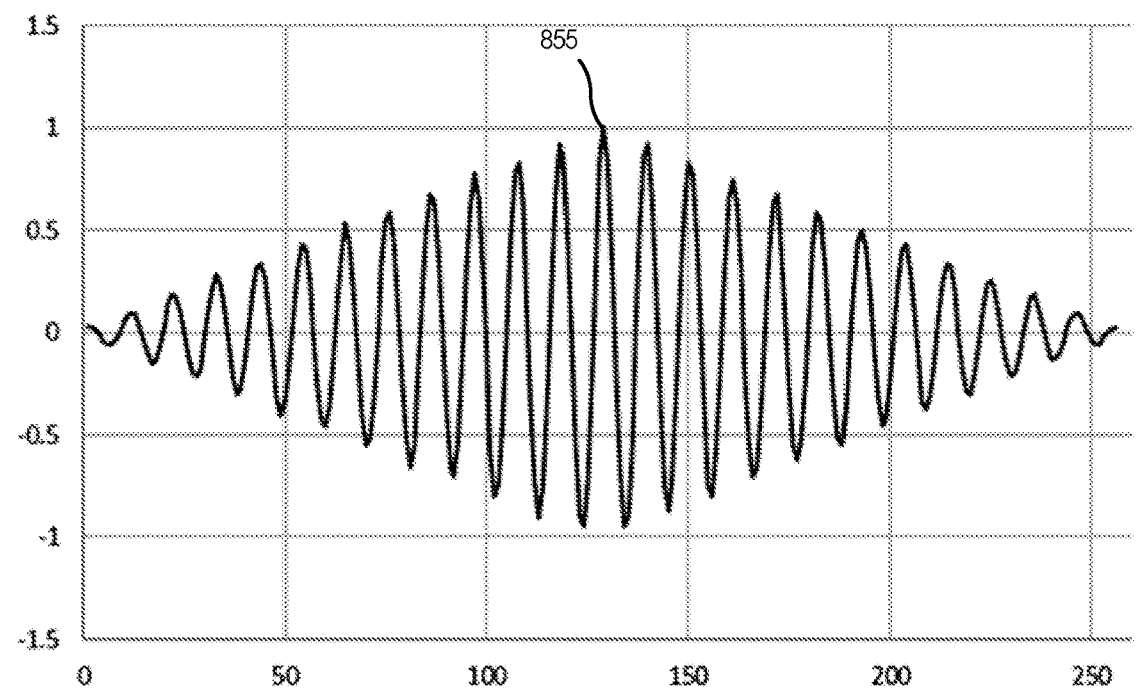

FIGS. 8A and 8B illustrate graphs 800 and 850 of waveforms representing the results of the multiplication of a demodulation sequence with a windowing function sequence. Waveform 805 represents the multiplication of digital in-phase demodulation sequence (waveform 705) with windowing function sequence 710 and waveform 855 represents the multiplication of digital quadrature demodulation sequence (waveform 755) with windowing function sequence 710.

As an example, consider a deployment where the digital in-phase demodulation sequence is generated from a sine function, the digital quadrature demodulation sequence is generated from a cosine function, and the windowing sequence is a triangular-shaped window, the final product (after summation by respective adders) is a representation of the input signal magnitude in the I (in-phase) and Q (quadrature) axes at the frequency of the sine and cosine functions used to generate the digital demodulation sequences. From the I and Q magnitudes (outputs of the respective adders), the overall magnitude of the signal is expressible as $$\sqrt{I^2+Q^2},$$

and the phase of the signal may be determined in accordance with the vector formed by the I and Q values.

The ability to vary the demodulation signal (i.e., the signal being demodulated (e.g., the output of ADC 330)) is important feature in digital demodulators. In many applications, the digital device may need to be able to change from one frequency to another frequency, depending on the environmental interference, such as noise. As an example, in a digital device with a touch sensitive display, the digital device may instruct a touch sensor to change the scan frequency due to display noise or charger noise. In order to support operation at multiple frequencies, the digital demodulator has to support the adjusting the frequency of the demodulation signal in order to demodulate the signal provided by the touch sensor (which has changed to a different frequency).

A prior art technique used to vary the demodulation signal for a digital demodulator involves changing the sampling time of an ADC used to digitize the signal. As an example, the sampling time of the ADC is changed to a different sampling point along the signal, resulting in different samples for demodulation. However, changing the sampling time of the ADC requires hardware support, which increases the complexity of the design. Additionally, changing the sampling time of the ADC necessitates fine adjustment steps of the ADC sampling time, which implies a higher base clock frequency. Furthermore, there is a limitation in demodulating two or more signals with different frequencies when an ADC with adjustable sampling time is used to vary the demodulation signal.

According to an example embodiment, the frequency of the demodulation signal is changed while keeping the sampling time of the ADC fixed, by changing the demodulation sequence used to demodulate the output of the ADC. Changing the demodulation signal frequency results in varying the demodulation signal for the digital demodulator. Furthermore, by fixing the sampling time of the ADC, the design of the ADC is kept simple and support for multiple signals with different frequencies is maintained. In an embodiment, changing the frequency of the demodulation sequence involves changing the number of coefficients in a single period of the demodulation sequence. In an embodiment, changing the frequency of the demodulation sequence involves changing the number of cycles of the input signal forming a single period of the demodulation sequence. In an embodiment, changing the frequency of the demodulation sequence involves changing both the number of coefficients in a single period of the demodulation sequence and the number of cycles of the input signal forming a single period of the demodulation sequence.

In an embodiment, the coefficients of the demodulation sequences may not be the same for every cycle of the input signal to the demodulator. Although the coefficients of the demodulation sequences may not the same for every cycle of the input signal (i.e., the periodicity of the demodulation sequences may be different from the periodicity of the input signal), over time and multiple cycles of the input signal, the demodulation sequences are periodic.

In an embodiment, the demodulation sequences are generated a priori and stored for subsequent use. Different demodulation sequences are generated for different frequencies, for example. In an embodiment, in-phase (I) and quadrature (Q) sequences are generated. In an embodiment, only one sequence (either in-phase or quadrature) is generated and stored (per different frequency), and the other sequence (either quadrature or in-phase) is derived from the generated sequence.

An example demodulation sequence is generated from an expression for the frequency of the input to the demodulator:

$$F_d = \frac{N_s}{T_{ADC} \cdot N_c}, \tag{1}$$

where $F_d$ is the equivalent demodulation signal frequency, $T_{ADC}$ is the sampling time of the ADC, $N_c$ is the number of coefficients in the demodulation sequence, and $N_s$ is the number of cycles of the input signal during a single period of the demodulation sequence. Therefore, for a fixed ADC sampling time and a desired frequency of the input signal, the number of coefficients in the demodulation sequence and the number of cycles of the input signal during a single period of the demodulation sequence can be found.

Example I and Q coefficients of the modulation sequence may be generated as follows:

$$I_n = \sin\left(2\pi n \frac{N_s}{N_c}\right) \tag{2}$$

and $$Q_n = \cos\left(2\pi n \frac{N_s}{N_c}\right), \tag{3}$$

where cos( ) is the trigonometric cosine function, sin( ) is the trigonometric sine function, $I_n$ is the n-th coefficient of the in-phase coefficients of the demodulation sequence and $Q_n$ is the n-th coefficient of the quadrature coefficients of the demodulation sequence.

Figure 9:
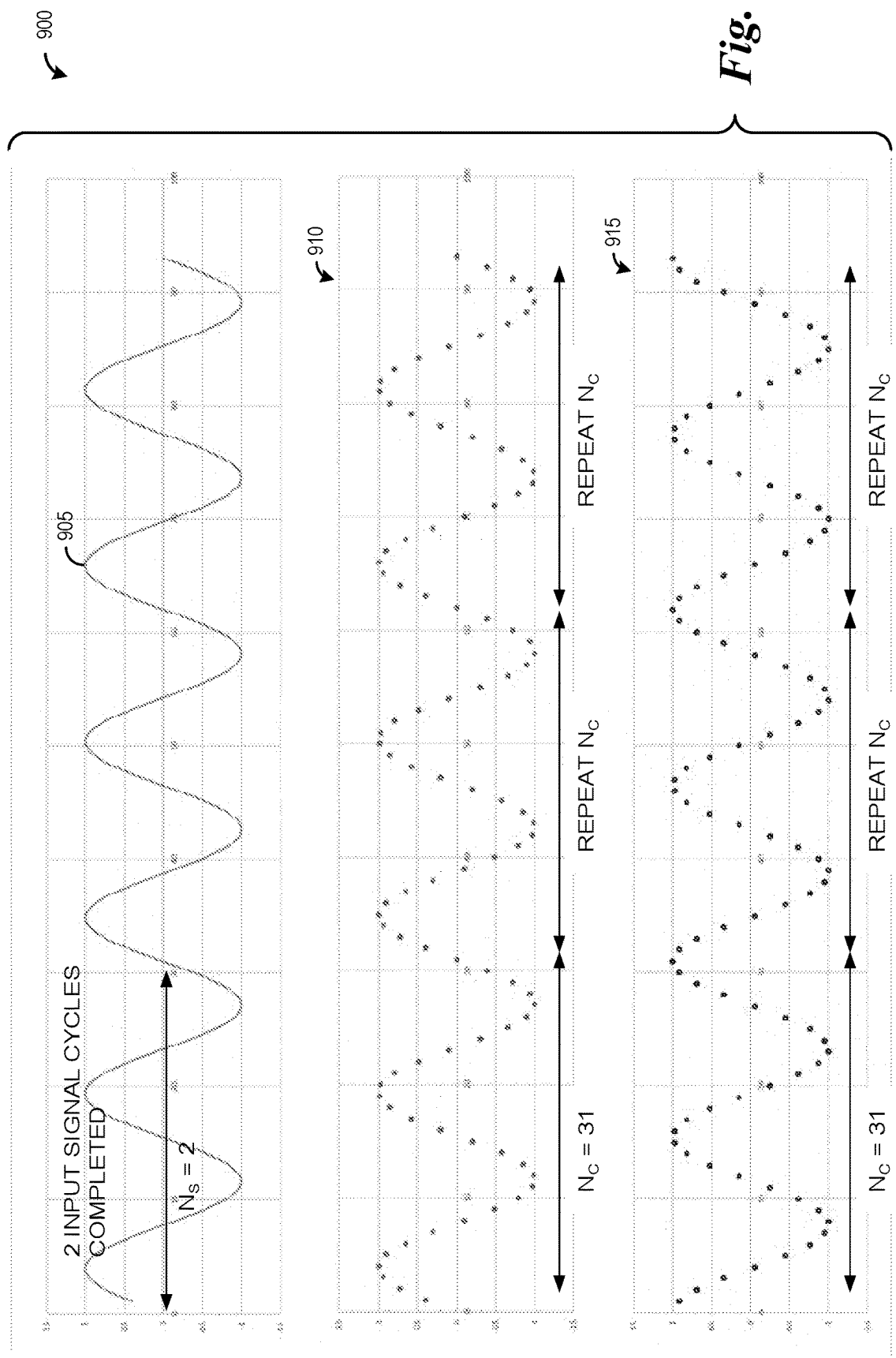
FIG. 9 illustrates graphs representing an input signal of the demodulator, in-phase coefficients of the demodulation sequence, and quadrature coefficients of the demodulation sequence, where the demodulation sequence has a frequency of 258 kHz and the sampling time of the ADC is 250 ns according to an embodiment.

FIG. 9 illustrates graphs 900 representing an input signal 905 of demodulator 415, in-phase coefficients 910 of the demodulation sequence, and quadrature coefficients 915 of the demodulation sequence, where the demodulation sequence has a frequency of 258 kHz and the sampling time of ADC 330 is 250 ns. Utilizing Equation (1), $N_c$ is equal to 31 coefficients, and $N_s$ is equal to 2 cycles. The coefficients of the demodulation sequence (in-phase coefficients 910 and quadrature coefficients 915) may be generated using Equations (2-3). As shown in FIG. 9, two cycles of input signal 905 correspond to 31 coefficients of the demodulation sequence or one period of the demodulation sequence.

Figure 10:
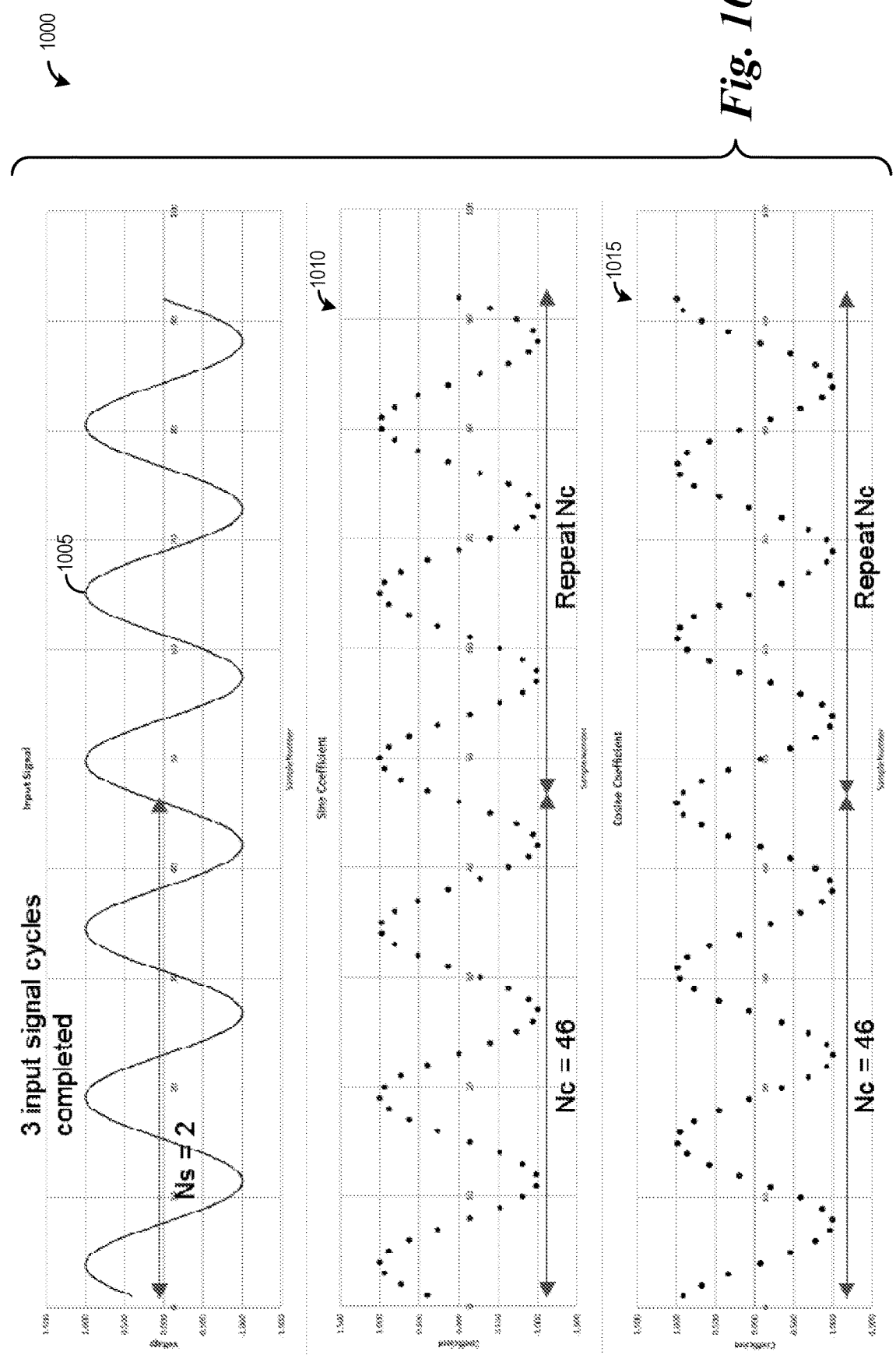
FIG. 10 illustrates graphs representing an input signal of the demodulator, in-phase coefficients of the demodulation sequence, and quadrature coefficients of the demodulation sequence, where the demodulation sequence has a frequency of 261 kHz and the sampling time of the ADC is 250 ns according to an embodiment.

FIG. 10 illustrates graphs 1000 representing an input signal 1005 of demodulator 415, in-phase coefficients 1010 of the demodulation sequence, and quadrature coefficients 1015 of the demodulation sequence, where the demodulation sequence has a frequency of 261 kHz and the sampling time of ADC 330 is 250 ns. Utilizing Equation (1), $N_c$ is equal to 46 coefficients, and $N_s$ is equal to 3 cycles. The coefficients of the demodulation sequence (in-phase coefficients 1010 and quadrature coefficients 1015) may be generated using Equations (2-3). As shown in FIG. 10, three cycles of input signal 1005 correspond to 46 coefficients of the demodulation sequence or one period of the demodulation sequence.

Figures 11, 12:
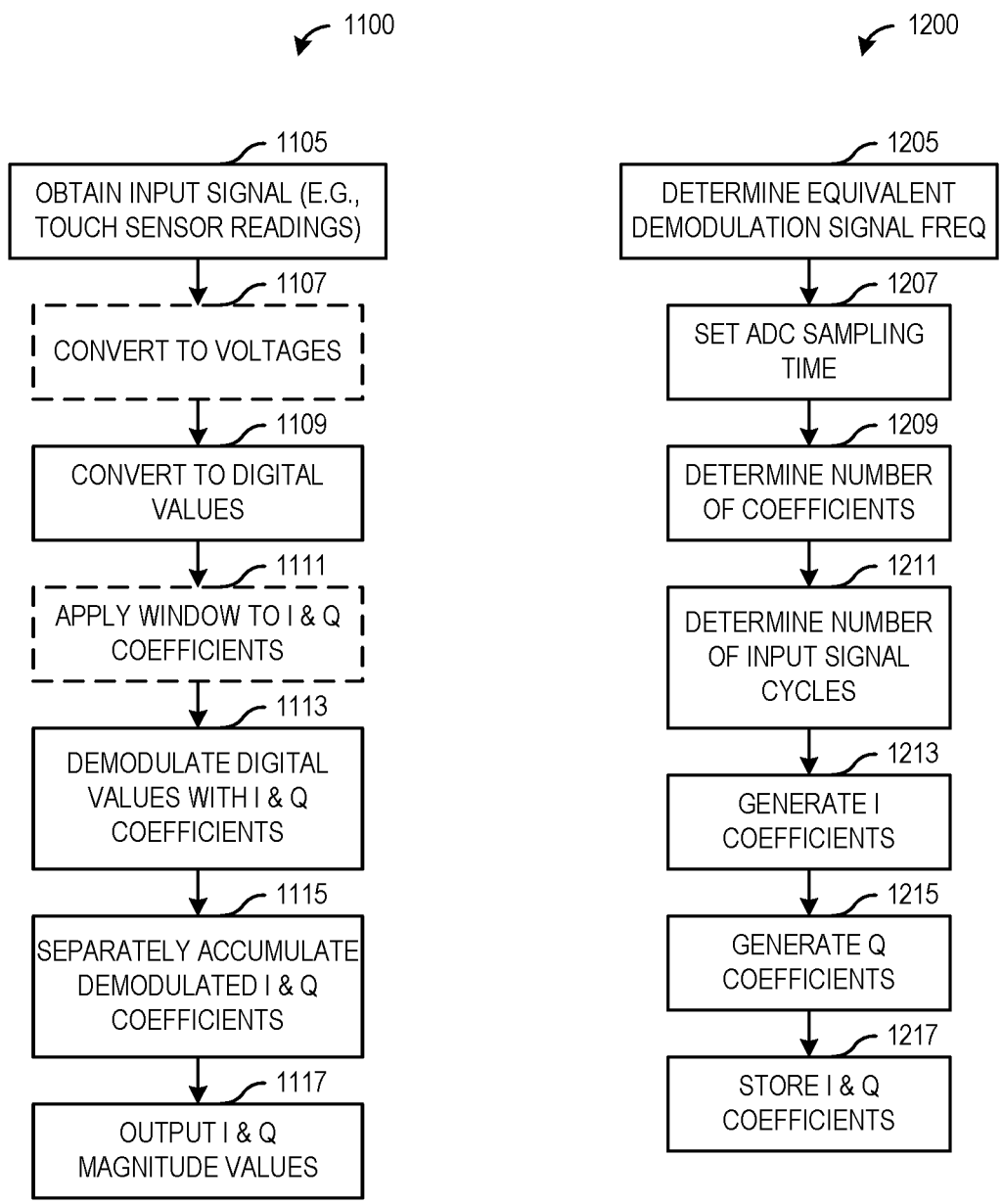
FIG. 11 illustrates a flow diagram of example operations occurring in a digital device demodulating a signal with a digital demodulator, where the demodulation sequence used to demodulate the signal has an adjustable frequency according to an embodiment.
FIG. 12 illustrates a flow diagram of example operations occurring in a device generating demodulating sequences according to an embodiment.

FIG. 11 illustrates a flow diagram of example operations 1100 occurring in a digital device demodulating a signal with a digital demodulator, where the demodulation sequence used to demodulate the signal has an adjustable frequency. Operations 1100 may be indicative of operations occurring in a digital device as the digital device, using a digital demodulator, demodulates a signal with a demodulation sequence with an adjustable frequency. The discussion of operations 1100 focuses on a digital device demodulating touch sensor signals from a touch sensitive display, but the example embodiments may be operable in other deployments where digital demodulation with adjustable frequency is desired.

Operations 1100 begin with the digital device obtaining an input signal, e.g., touch sensor readings (block 1105). As discussed previously, sense lines of the touch sensitive display provide output charge readings (e.g., currents) in accordance with detected capacitance from a finger or a stylus. The magnitude of the charge readings may be proportional to the detected capacitance, for example. The digital device optionally converts the input signal to voltages (block 1107). In some deployments, the input signal may be currents or charges. In such a situation, the input signal may be converted into voltages. A CVC converts the input signal (i.e., the charge readings) into voltages, for example.

The voltages are converted into digital values (block 1109). An ADC converts the voltages into a stream of digital values. As discussed previously, the ADC uses a fixed sampling time and sampling frequency to simplify the design of the ADC, as well as maximize the flexibility of the ADC. The sampling frequency of the ADC should be significantly greater than the frequency of the output of the sense lines of the touch sensitive display to help simplify filter design and reduce signal aliasing.

The digital device optionally applies a windowing function to the demodulation sequences (block 1111). Coefficients of a sequence corresponding to the windowing function may be retrieved from a memory, where they were stored after generation. Alternatively, the coefficients of the sequence corresponding to the windowing function are received from a device generating the coefficients. In an embodiment, the demodulation sequences, i.e., the in-phase coefficients and the quadrature coefficients may be retrieved from a memory. A plurality of demodulation sequences may be stored in the memory, after being generated for different demodulation frequencies, ADC sampling times, sequence lengths, and number of input signal cycles per period of the demodulation sequences. Alternatively, the demodulation sequences are generated by the digital device based on a specified demodulation frequency, the ADC sampling time, the sequence length, and the number of input signal cycles per period of the demodulation sequences. Alternatively, the demodulation sequences are received from a device generating the demodulation sequences.

The digital device demodulates the digital values of the input signal with the demodulation sequences (block 1113). The digital device demodulates the digital values of the input signal by multiplying the digital values of the input signal with the demodulation sequences. As an example, the digital values of the input signal are multiplied with the in-phase coefficients (windowed in-phase coefficients if a windowing function is used). Similarly, the digital values of the input signal are multiplied with the quadrature coefficients (windowed quadrature coefficients if a windowing function is used). The demodulation sequences may be generated a priori and stored for subsequent use. In such a situation, a plurality of demodulation sequences may be generated, for a variety of demodulation frequencies, numbers of coefficients, numbers of input signal cycles per period of the demodulation sequences, etc. Alternatively, the demodulation sequences are generated on an as needed basis, by the digital device, for example. In such a situation, the demodulation sequences are generated for a specific set of parameters (demodulation frequency, number of coefficients, numbers of input signal cycles, and so on) and used to demodulate the digital values of the input signal.

The digital device accumulates the demodulated digital values of the input signal (block 1115). The demodulated digital values are accumulated separately. In other words, the digital values multiplied with the in-phase coefficients are accumulated with one another, and the digital values multiplied with the quadrature coefficients are accumulated with one another. Adders may be used accumulate the demodulated digital values, for example. The accumulated values are outputted (block 1117). The outputted accumulated values, i.e., the in-phase magnitudes and the quadrature magnitudes may undergo additional signal processing, such as filtering, amplification, etc., or computational processing, as described previously.

FIG. 12 illustrates a flow diagram of example operations 1200 occurring in a device generating demodulating sequences. Operations 1200 may be indicative of operations occurring in a device, such as a device dedicated to generating demodulating sequences for other devices or a digital device dynamically generating demodulating sequences for demodulating input signals, as the device generates demodulating sequences.

Operations 1200 begin with the device determining an equivalent demodulation signal frequency (block 1205). The equivalent demodulation signal frequency, denoted $F_d$, is the desired demodulation frequency of the demodulator. The equivalent demodulation signal frequency is a function of the sampling time of the ADC, the number of coefficients in the demodulation sequence, and the number of cycles of the input signal during a single period of the demodulation sequence. The device sets the ADC sampling time (block 1207). The ADC sampling time may be specified by a designer of the digital device or by a technical standard. In an embodiment, the ADC sampling time is fixed and does not change.

The device determines the number of coefficients in the demodulation sequence (block 1209). In general, the number of coefficients may be arbitrary, but an excessively large number of coefficients may cause issues in a deployment, such as increased memory storage (for storing the coefficients), increased buffer size (as related to storing and accumulating a larger number multiplier results), and so on. The device determines the number of input signal cycles during a single period of the demodulation sequence (block 1211). As with the number of coefficients of the demodulation sequence, the number of input signal cycles may be arbitrary, but an excessively large number of input signal cycles may cause issues in a deployment, similar to the issues discussed with the number of coefficients of the demodulation sequence. As an example, the device uses Equation (1) to determine the equivalent demodulation signal frequency (block 1205), determine the number of coefficients (block 1209), and determine the number of input signal cycles (block 1211). In an embodiment, the number of coefficients of the demodulation sequence and the number of input signal cycles should be minimized to help decrease memory storage and buffer requirements.

The device generates the in-phase coefficients (block 1213). The device may use Equation (2) to generate the in-phase coefficients, for example. The device uses the number of coefficients (block 1209) and the number of input signal cycles (block 1211) to generate the in-phase coefficients. The device generates the quadrature coefficients (block 1215). The device may use Equation (3) to generate the quadrature coefficients, for example. The device uses the number of coefficients (block 1209) and the number of input signal cycles (block 1211) to generate the quadrature coefficients. Alternatively, the device generates either the in-phase coefficients (block 1213) or the quadrature coefficients (block 1215) and applies a phase shift to the coefficients to generate the quadrature coefficients or the in-phase coefficients. As an example, the phase shift is a +90 degree shift.

The device stores the in-phase and quadrature coefficients (block 1217). The in-phase and quadrature coefficients may be stored in a memory of a digital device or stored in a database. The in-phase and quadrature coefficients may be provided to a digital device during a manufacturing or configuration process. In addition to the in-phase and quadrature coefficients, information such as the equivalent demodulation signal frequency may be stored. The storing of the equivalent demodulation signal frequency may be used as an index to retrieve the in-phase and quadrature coefficients associated with a particular equivalent demodulation signal frequency, for example.

Operations 1200 also apply in a situation where a digital device dynamically generates the in-phase and quadrature coefficients on an as needed basis. However, rather than storing the in-phase and quadrature coefficients in a memory, along with the associated equivalent demodulation signal frequency, the digital device stores the in-phase and quadrature coefficients in a buffer or registers, where they can be readily used to demodulate the input signal.

Figure 13:
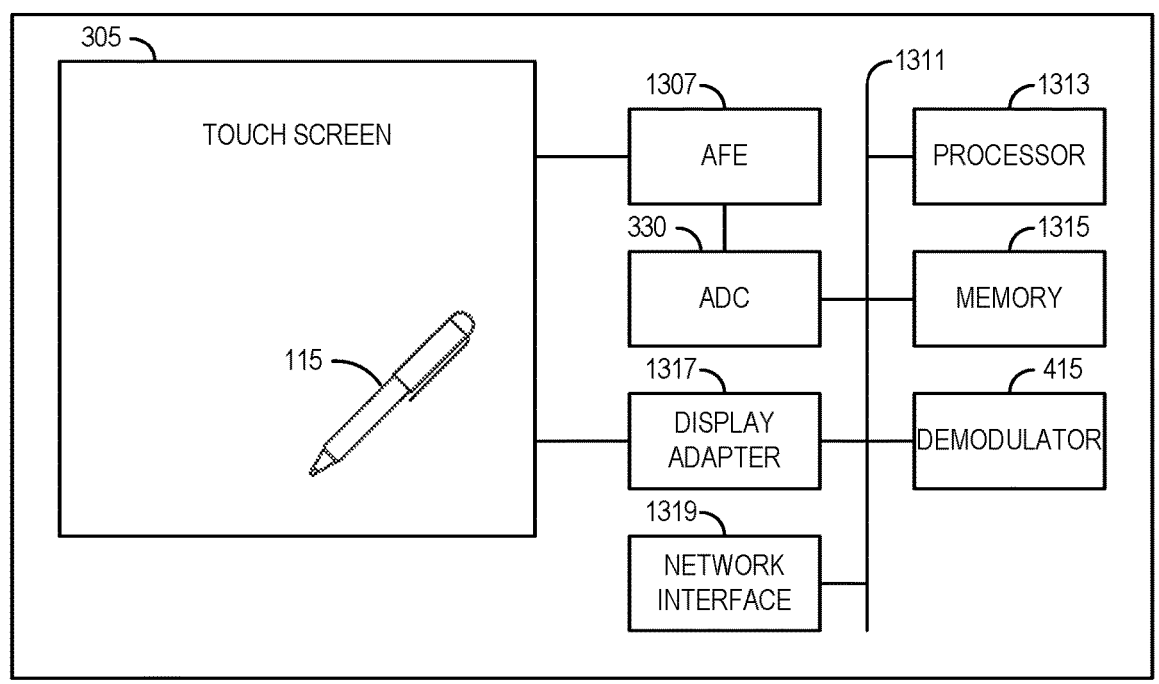
FIG. 13 illustrates an example digital device according to an embodiment.

FIG. 13 illustrates an example digital device 1300. Digital device 1300 may include the methods and apparatus disclosed herein. For example, digital device 1300 includes demodulator 415 that utilizes demodulation sequences with different numbers of coefficients and numbers of input signal cycles to realize different equivalent demodulation signal frequencies.

Specific digital devices may utilize all of the components shown or only a subset of the components, and levels of integration may vary from device to device. Furthermore, a specific digital device may contain multiple instances of a component, such as multiple processors, memories, network interfaces, etc. Digital device 1300 includes touch sensitive touch screen 305, an AFE 1307 that converts charge or current signals provided by sense lines of touch screen 305 into voltage levels, and ADC 330 that digitizes the voltage levels. ADC 330 operates at a fixed sampling time. Digital device 1300 also includes demodulator 415, a processor 1313, a memory 1315, a display adapter 1317, and a network interface 1319. Although shown as a single unit, processor 1313 may be implemented as multiple processing units. ADC 330, processor 1313, memory 1315, demodulator 415, display adapter 1317, and network interface 1319 may be connected to a bus 1311.

Demodulator 415 demodulates digitized input signals from ADC 330 using demodulation sequences that are selected in accordance with a desired demodulation frequency, number of coefficients, number of input signal cycles per period of the demodulation sequence, and the sampling time of ADC 330. Processor 1313 may provide demodulator 415 with the demodulation sequences selected from a plurality of demodulation sequences based on the desired demodulation frequency. Processor 1313 may, prior to providing the demodulation sequences to demodulator 415, apply a windowing function (i.e., a windowing sequence) to the demodulation sequences.

Display adapter 1317 converts data from processor 1313 into display information that is displayed on touch screen 305. Network interface 1319, which may comprise wired links, such as an Ethernet cable, or wireless links to access nodes or different networks. Network interface 1319 allows digital device 1300 to communicate with remote units via the networks. For example, network interface 1319 may provide wireless communication via one or more transmitters/transmit antennas and one or more receivers/receive antennas. In an embodiment, digital device 1300 is coupled (e.g., wirelessly) to a local-area network or a wide-area network for data processing and communications with remote devices, such as other processing units, the Internet, or remote storage facilities.

Example embodiments of the invention are summarized here. Other embodiments can also be understood from the entirety of the specification as well as the claims filed herein.

Example 1. A device including: an analog to digital converter (ADC) configured to convert an input signal into a digital signal by sampling the input signal at a fixed sampling time; a first multiplier operatively coupled to the ADC, the first multiplier configured to multiply the digital signal with in-phase coefficients, the in-phase coefficients generated to produce a demodulated in-phase signal at a demodulation signal frequency; a first adder operatively coupled to the first multiplier, the first adder configured to accumulate the demodulated in-phase signal to output in-phase magnitude values; a second multiplier operatively coupled to the ADC, the second multiplier configured to multiply the digital signal with quadrature coefficients, the quadrature coefficients generated to produce a demodulated quadrature signal at the demodulation signal frequency; and a second adder operatively coupled to the second multiplier, the second adder configured to accumulate the demodulated quadrature signal to output quadrature magnitude values.

Example 2. The device of example 1, where the in-phase coefficients and the quadrature coefficients are generated in accordance with the demodulation signal frequency and stored in a memory.

Example 3. The device of one of examples 1 or 2, further including: a third multiplier operatively coupled in between the first multiplier and the in-phase coefficients, the third multiplier configured to multiply the in-phase coefficients with digital windowing function coefficients; and a fourth multiplier operatively coupled in between the second multiplier and the quadrature coefficients, the fourth multiplier configured to multiply the quadrature coefficients with the digital windowing function coefficients.

Example 4. The device of one of examples 1 to 3, where the digital windowing function coefficients include digital filter coefficients.

Example 5. The device of one of examples 1 to 4, where the input signals include outputs of a sensor array of a touch sensitive display screen.

Example 6. The device of one of examples 1 to 5, where the fixed sampling time and the demodulation signal frequency are different.

Example 7. The device of one of examples 1 to 6, where the in-phase coefficients are expressible as $\sin 3 \times 2\pi\, k\, n$, and where the quadrature coefficients are expressible as $\cos 3 \times 2\pi\, k\, n$, where $\cos(\ )$ is the trigonometric cosine function, $\sin(\ )$ is the trigonometric sine function, $n$ is a coefficient index, and $k$ is the number of digital in-phase coefficients.

Example 8. The device of one of examples 1 to 7, where $n$ and $k$ are functions of the demodulation signal frequency.

Example 9. A method for demodulating a signal, the method including: digitizing the signal at a fixed sampling time; demodulating the digitized signal into a demodulated in-phase signal and a demodulated quadrature signal, the demodulating including: multiplying the digitized signal with in-phase coefficients generated to produce a demodulated in-phase signal at a demodulation signal frequency, and multiplying the digitized signal with quadrature coefficients generated to produce a demodulated quadrature signal at the demodulation signal frequency; and accumulating the demodulated in-phase signal and the demodulated quadrature signal to produce in-phase magnitude values and quadrature magnitude values.

Example 10. The method of example 9, further including: multiplying the in-phase coefficients with digital windowing function coefficients; and multiplying the quadrature coefficients with the digital windowing function coefficients.

Example 11. The method of one of examples 9 or 10, where the signal includes sensory information from a sensor array of a touch sensitive display screen.

Example 12. The method of one of examples 9 to 11, where the in-phase coefficients are expressible as sin 3×2π k n, and where the quadrature coefficients are expressible as cos 3×2π k n, where cos( ) is the trigonometric cosine function, sin( ) is the trigonometric sine function, n is a coefficient index, and k is the number of digital in-phase coefficients.

Example 13. The method of one of examples 9 to 12, where n and k are functions of the demodulation signal frequency.

Example 14. A method implemented by a device, the method including: determining a demodulation signal frequency of a demodulator, a sampling time of a signal demodulated by the demodulator, and a number of demodulation coefficients; determining a number of signal cycles in accordance with the demodulation signal frequency, the sampling time, and the number of demodulation coefficients; generating the number of demodulation coefficients of in-phase coefficients; generating the number of demodulation coefficients of quadrature coefficients; and storing the in-phase coefficients and the quadrature coefficients.

Example 15. The method of example 14, where the demodulation signal frequency is determined in accordance with the number of signal cycles, the sampling time of the signal, and the number of demodulation coefficients.

Example 16. The method of one of examples 14 or 15, where the demodulation signal frequency is expressible as: Fd=Ns/(Tadc×Nc), where Fd is the demodulation signal frequency, Tadc is the sampling time of the signal, Nc is the number of demodulation coefficients, and Ns is the number of input signal cycles.

Example 17. The method of one of examples 14 to 16, where the in-phase coefficients and the quadrature coefficients are generated in accordance with trigonometric functions, the number of input signal cycles, and the number of demodulation coefficients.

Example 18. The method of one of examples 14 to 17, where an n-th in-phase coefficient is expressible as In=sin 2π·n·Ns N, and an n-th quadrature coefficient is expressible as Qn=cos 2π·n·Ns Nc, where In is the n-th in-phase coefficient, Qn is the n-th quadrature coefficient, cos( ) is the trigonometric cosine function, and sin( ) is the trigonometric sine function.

Example 19. The method of one of examples 14 to 18, where the in-phase coefficients and the quadrature coefficients are generated for a plurality of different demodulation signal frequencies and a plurality of different numbers of demodulation coefficients.

Example 20. The method of one of examples 14 to 19, where the number of demodulation coefficients and the number of cycles are changed to adjust the demodulation signal frequency.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising: an analog to digital converter (ADC) configured to convert an input signal into a digital signal by sampling the input signal at a fixed sampling time;
   a first multiplier operatively coupled to the ADC, the first multiplier configured to multiply the digital signal with in-phase coefficients, the in-phase coefficients generated to produce a demodulated in-phase signal at a demodulation signal frequency, and the in-phase coefficients expressible as In=sin $(2\pi \cdot n \cdot N_s/N_c)$ where sin( ) is the trigonometric sine function, In is the n-th in-phase coefficient, $N_s$ is the number of input cycles, n is a coefficient index, and $N_c$ is the number of demodulation coefficients;
   a first adder operatively coupled to the first multiplier, the first adder configured to accumulate the demodulated in-phase signal to output in-phase magnitude values;
   a second multiplier operatively coupled to the ADC, the second multiplier configured to multiply the digital signal with quadrature coefficients, the quadrature coefficients generated to produce a demodulated quadrature signal at the demodulation signal frequency, and the quadrature coefficients expressible as Qn=COS $(2\pi \cdot n \cdot N_s/N_c)$, where cos( ) is the trigonometric cosine function and Qn is the n-th quadrature coefficient; and
   a second adder operatively coupled to the second multiplier, the second adder configured to accumulate the demodulated quadrature signal to output quadrature magnitude values.

2. The device of claim 1, wherein the in-phase coefficients and the quadrature coefficients are generated in accordance with the demodulation signal frequency and stored in a memory.

3. The device of claim 1, further comprising:
   a third multiplier operatively coupled in between the first multiplier and the in-phase coefficients, the third multiplier configured to multiply the in-phase coefficients with digital windowing function coefficients; and
   a fourth multiplier operatively coupled in between the second multiplier and the quadrature coefficients, the fourth multiplier configured to multiply the quadrature coefficients with the digital windowing function coefficients.

4. The device of claim 3, wherein the digital windowing function coefficients comprise digital filter coefficients.

5. The device of claim 1, wherein the input signals comprise outputs of a sensor array of a touch sensitive display screen.

6. The device of claim 1, wherein the fixed sampling time and the demodulation signal frequency are different.

7. The device of claim 1, wherein n is a function of the demodulation signal frequency.

8. The device of claim 1, wherein the in-phase coefficients are expressible as $$\sin\left(\frac{3\times 2\pi}{k}n\right),$$

and wherein the quadrature coefficients are expressible as $$\cos\left(\frac{3\times 2\pi}{k}n\right),$$

where n is a coefficient index and k is the number of digital in-phase coefficients.

9. A method for demodulating a signal, the method comprising:
digitizing the signal at a fixed sampling time;
demodulating the digitized signal into a demodulated in-phase signal and a demodulated quadrature signal, the demodulating comprising:
multiplying the digitized signal with in-phase coefficients generated to produce a demodulated in-phase signal at a demodulation signal frequency, and the in-phase coefficients expressible as In=sin $(2\pi \cdot n \cdot N_s/N_c)$ where sin( ) is the trigonometric sine function, In is the n-th in-phase coefficient, $N_s$ is the number of input cycles, n is a coefficient index, and $N_c$ is the number of demodulation coefficients;
multiplying the digitized signal with quadrature coefficients generated to produce a demodulated quadrature signal at the demodulation signal frequency, and the quadrature coefficients expressible as Qn=COS $(2\pi \cdot n \cdot N_s/N_c)$, where cos( ) is the trigonometric cosine function and Qn is the n-th quadrature coefficient; and
accumulating the demodulated in-phase signal and the demodulated quadrature signal to produce in-phase magnitude values and quadrature magnitude values.

10. The method of claim 9, further comprising:
multiplying the in-phase coefficients with digital windowing function coefficients; and
multiplying the quadrature coefficients with the digital windowing function coefficients.

11. The method of claim 9, wherein the signal comprises sensory information from a sensor array of a touch sensitive display screen.

12. The method of claim 9, wherein n is a function of the demodulation signal frequency.

13. A method implemented by a device, the method comprising:
determining a number of demodulation coefficients from an arbitrary set of numbers; determining a demodulation signal frequency of a demodulator and a sampling time of a signal demodulated by the demodulator;
determining a number of signal cycles in accordance with the demodulation signal frequency, the sampling time, and the number of demodulation coefficients;
generating the number of demodulation coefficients of in-phase coefficients, the in-phase coefficients expressible as In=sin $(2\pi \cdot n \cdot N_s/N_c)$ where sin( ) is the trigonometric sine function, In is the n-th in-phase coefficient, $N_s$ is the number of input cycles, n is a coefficient index, and $N_c$ is the number of demodulation coefficients;
generating the number of demodulation coefficients of quadrature coefficients, the quadrature coefficients expressible as Qn=COS $(2\pi \cdot n \cdot N_s/N_c)$, where cos( ) is the trigonometric cosine function and Qn is the n-th quadrature coefficient; and
storing the in-phase coefficients and the quadrature coefficients.

14. The method of claim 13, wherein the demodulation signal frequency is determined in accordance with the number of signal cycles, the sampling time of the signal, and the number of demodulation coefficients.

15. The method of claim 14, wherein the demodulation signal frequency is expressible as:

$Fd=Ns/(Tadc\times Nc),$ where Fd is the demodulation signal frequency, Tadc is the sampling time of the signal, Nc is the number of demodulation coefficients, and Ns is the number of input signal cycles.

16. The method of claim 13, wherein the in-phase coefficients and the quadrature coefficients are generated in accordance with trigonometric functions, the number of input signal cycles, and the number of demodulation coefficients.

17. The method of claim 13, wherein the in-phase coefficients and the quadrature coefficients are generated for a plurality of different demodulation signal frequencies and a plurality of different numbers of demodulation coefficients.

18. The method of claim 13, wherein the number of demodulation coefficients and the number of cycles are changed to adjust the demodulation signal frequency.

19. The method of claim 13, wherein n is a function of the demodulation signal frequency.

20. The method of claim 13, wherein the fixed sampling time and the demodulation signal frequency are different.

* * * * *

UNITED STATES PATENT AND TRADEMARK OFFICE
CERTIFICATE OF CORRECTION

PATENT NO. : 11,765,006 B2
APPLICATION NO. : 17/245890
DATED : September 19, 2023
INVENTOR(S) : Putra et al.

It is certified that error appears in the above-identified patent and that said Letters Patent is hereby corrected as shown below:

In the Claims

In Column 16, in Claim 1, Line 38, delete "COS" and insert -- cos --.

In Column 17, in Claim 9, Line 35, delete "COS" and insert -- cos --.

In Column 18, in Claim 13, Line 17, delete "COS" and insert -- cos --.

Signed and Sealed this
Twelfth Day of December, 2023

Katherine Kelly Vidal
*Director of the United States Patent and Trademark Office*